United States Patent [19]
Greco et al.

[11] Patent Number: 5,371,047
[45] Date of Patent: Dec. 6, 1994

[54] CHIP INTERCONNECTION HAVING A BREATHABLE ETCH STOP LAYER

[75] Inventors: Stephen E. Greco, LaGrangeville; Kris V. Srikrishnan, Wappingers Falls, both of N.Y.

[73] Assignee: International Business Machines Corporation, Armonk, N.Y.

[21] Appl. No.: 968,789

[22] Filed: Oct. 30, 1992

[51] Int. Cl.⁵ .............................................. H01L 21/90
[52] U.S. Cl. .................................. 437/238; 437/195; 148/DIG. 43; 156/644
[58] Field of Search ............... 437/195, 203, 235, 238; 148/DIG. 43; 257/759, 760, 774; 156/643, 644, 648

[56] References Cited

U.S. PATENT DOCUMENTS

| | | | |
|---|---|---|---|
| 4,451,326 | 5/1984 | Gwozdz | 156/643 |
| 4,481,283 | 11/1984 | Kerr et al. | 430/319 |
| 4,692,205 | 9/1987 | Sachdev et al. | 156/643 |
| 4,719,125 | 1/1988 | Anello et al. | 437/231 |
| 4,884,120 | 11/1989 | Mochizuki et al. | 357/68 |
| 4,897,153 | 1/1990 | Cole et al. | 156/643 |
| 4,908,298 | 3/1990 | Hefferon et al. | 430/313 |
| 4,954,142 | 9/1990 | Carr et al. | 51/309 |
| 5,000,818 | 3/1991 | Thomas et al. | 156/643 |
| 5,055,906 | 10/1991 | Mase et al. | 357/54 |
| 5,070,037 | 12/1991 | Leisure et al. | 437/195 |
| 5,091,289 | 2/1992 | Cronin et al. | 430/312 |

FOREIGN PATENT DOCUMENTS

| | | | |
|---|---|---|---|
| 326293 | 8/1989 | European Pat. Off. | 437/195 |
| 298330 | 2/1992 | Germany | 437/195 |
| 55-071040 | 5/1980 | Japan | 437/195 |
| 55-138859 | 10/1980 | Japan | 257/760 |
| 56-015052 | 2/1981 | Japan | 437/195 |
| 58-034945 | 3/1983 | Japan | 257/760 |

OTHER PUBLICATIONS

Geffken, "Multi-Level Metallurgy for Master Image Structured Logic", IEDM 1983 Proceedings, pp. 542–545.

Eggers et al., "A Polyimide-Isolated Three-Layer Metallization System", IEEE V-MIC Conf. Proceedings, 1985, pp. 163–169.

Srikrishnan et al., "Multilevel VLSI Interconnection-An Optimum Approach?", American Institute of Physics, 1986, pp. 247–254.

Homma et al., "New Polyimide Film Paves Way for Super High-Speed Logic Devices", JEE, Nov. 1988, pp. 74–79.

*Primary Examiner*—Olik Chaudhuri
*Assistant Examiner*—Ken Horton

[57] ABSTRACT

An integrated circuit having organic dielectric between interconnection layers eliminates damage caused by vapors outgassing from the organic dielectric by the use of a two-component organic layer having a breathable etch resistant organic layer above the main organic dielectric layer, both of the organic layers remaining in the final circuit. The etch resistant layer is resistant to the etchant used to pattern the layer of interconnect above the organic dielectric.

4 Claims, 1 Drawing Sheet

CHIP INTERCONNECTION HAVING A BREATHABLE ETCH STOP LAYER

TECHNICAL FIELD

The field of the invention is that of integrated circuits using organic dielectric insulators for electrical isolation in their multilevel interconnection.

BACKGROUND ART

It is well known in the art of multilevel interconnection that several wiring layers are required to connect together the devices available on a very large scale integrated (VLSI) chip into a usable circuit. The interconnection structure consists of electrically conducting fine wires of at least one layer separated by dielectric insulating films. The interconnection structure, comprising thin wires embedded in the insulator, is similar to a transmission line, in that there is a propagation delay of the signals being transmitted. This delay, often referred to as RC delay (R=resistance; C=capacitance), has become a significant part of the overall delay of the circuit in fast switching digital devices.

One approach has been to use organic dielectrics with lower dielectric constant than conventional inorganic insulating materials in order to minimize the capacitance term in the RC delay. The most commonly used dielectric thin film in the art has been $SiO_2$, which has a dielectric constant, or a relative permittivity, of 4.0. Organic polymers, such as polyimides, have dielectric constants lower than 4.0 and thus are very attractive candidates for dielectric films for multilevel interconnection. In spite of the availability of a variety of polyimides, their use as multilevel insulators has been limited because of some unfavorable characteristics of the organic insulators. One of two major limitations was that if standard reactive ion etching (RIE) was used to define a conventional aluminum conductor, the open structure of the organic insulator absorbed a large amount of $Cl_2$ from the RIE plasma, which caused corrosion of the aluminum lines. The second limitation was that the organic insulator is never 100% cured in spite of all precautions, leaving trace amounts of volatile components that tend to desorb or outgas on subsequent heating.

In one application that has been used for relatively large feature sizes, R. M. Geffken, "Multi-Level Metallurgy for Master Image Structured Logic," IEDM 1983 Proceedings, pp. 542-545, an organic dielectric was used as an insulator for interconnection, a metal interconnection layer was patterned by a lift-off technique. The resist was formed by conventional double exposure to have a negative (undercut) profile suitable for lift-off definition of the metal pattern. The etching of patterns in the organic insulator, mostly vias, are done for large dimension apertures by wet etching before curing and for smaller dimensions by reactive etching with sloped resist. In the lift-off metal process, several of the organic layers are in contact together and the outgassing component freely escaped through the layers. However, since metal RIE is needed to define a conductor pattern, an impermeable layer had to be used to prevent the absorption of unwanted etching gases, such as chlorine, from the reactive ion etching process. The organic insulators are carefully cured and baked and sealed with an inorganic thin film such as silicon nitride to seal all of polyimide surface from the etching gases. In this method, H. Eggers et al., "A Polyimide-Isolated Three-Layer Metallization System", IEEE V-MIC Conf. Proceedings, 1985, pp. 163-169, sloped via surfaces of the polyimides are also coated with the inorganic insulator. A great deal of precaution has to be taken in order to avoid defects or trapped outgassing material, as these can affect the reliability of the structure during later processing and use.

Both of these techniques, lift-off metal patterning and sloped vias, are more or less satisfactory for coarse feature sizes, but have become difficult to extend to the finer dimensions required by the shrinking of component size and the increase in the number of circuits on a chip. The new requirements are for fine wires and spaces (1 micron and less) and for vertical vias connecting wires between levels. These dimensions in turn need the use of metal patterning techniques such as reactive ion etching and metal patterning by chemical mechanical polishing (metal damascene) as shown in U.S. Pat. No. 4,954,142.

Another design requirement for high density wiring is the use of partially intersecting vias and wires. According to this requirement, the via opening (sometime referred to as a stud or pillar because of its vertical profile) and the metal wire over the via need to make contact only over a portion of the common surface. This means that, if reactive ion etching is used to define vias, any over etching will etch deeper holes into the insulator below the via level. This effect leads to problems in subsequent filling of the via hole by metal deposition processes such as chemical vapor deposition, hot sputtering etc. An etch stop layer present between the two dielectric layers will provide the cushion for over-etching, and will minimize the unwanted etching in the insulator below. This is an important requirement for ultra large scale integration to allow partially overlapping connections.

In addition to protection from the chemicals used in metal patterning, protection of the organic layer below while etching the organic layer above is also required. One of the ways to meet this additional requirement is by use of photosensitive polyimide. U.S. Pat. No. 5,091,289 illustrates a prior art circuit in which a photosensitive organic layer is patterned and converted to a patterned organic dielectric layer. The layer below is made non photosensitive by a prior process and hence the need to protect the layer below is avoided. However, photosensitive polyimides shrink considerably on curing from the loss of photoactive components, resulting in sloped vias, which is undesirable for ULSI wiring.

Another requirement for a metal damascene process, in which grooves in an insulator are overfilled with metal and the excess metal is removed by polishing, is that the insulator be a good polish stop. Analogous to the etching process, in the absence of a good polish stop, overpolishing will thin the insulator once the excess metal is removed and thereby lead to variable insulator thickness as well as unacceptably low insulator thickness in spots. Organic insulators have notoriously low resistance to polishing process.

SUMMARY OF THE INVENTION

The invention relates to an integrated circuit in which a composite dielectric layer is formed from two layers that both remain in the final circuit. The main dielectric layer is organic, preferably a polyimide layer and the second layer, placed above the main layer, is relatively thin, etch resistant, and permeable to outgassing. The etch resistant layer protects the main layer in at least one of the following processes: the patterning of organic insulator over the main layer such as reactive ion etching; the etching of a metal pattern over the main insulator and keeping unwanted gases from the main layer; and protecting the main layer from metal polishing process in a damascene metal process.

BEST MODE OF CARRYING OUT THE INVENTION

Figure 1:
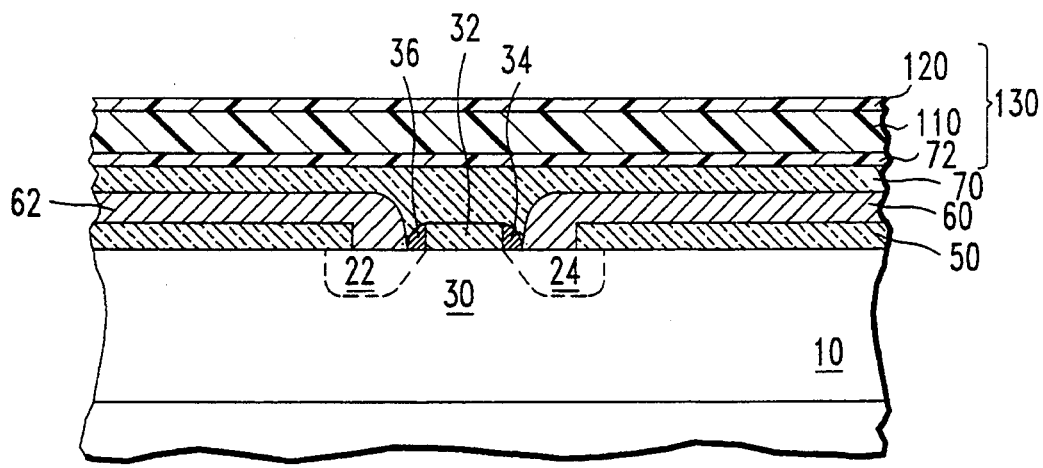
FIGS. 1–4 illustrate a portion of an integrated circuit in different steps of construction according to the invention.

Referring now to FIG. 1, there is illustrated a portion of an integrated circuit showing field effect transistor 30 formed in silicon substrate 10. About transistor 30 there is a silicon dioxide layer 50 for insulation, above which is formed polysilicon (poly) layers 60 and 62 which are the first layer of interconnect in this case, connecting source 22 and drain 24. Above poly 60, there is deposited layer 70, another layer of silicon dioxide that is covered by layer 72, a protective layer of silicon nitride that serves to protect the underlying transistors from moisture and/or mobile ions that may escape from the organic dielectrics.

Above layer 72 there is deposited a second level dielectric layer comprising layers 110 and 120, collectively referred to as composite dielectric 130. Layer 110 is the main dielectric layer having a nominal thickness of 5K to 10K Å and layer 120 is a relatively thin (about 1000–2500 Å) etch resistant layer 72. Layer 110 is illustratively polyimide, and layer 120 is illustratively polyimide loaded with silicon for etch resistance, as is known in the art. Layer 120 is permeable to vapors that outgas from layer 110, so that pressure does not build up during periods of elevated temperature during the remainder of the processing or during circuit operation. The remaining figures will show how this composite layer is patterned to expose an aperture through which contact is made from an upper interconnection layer down to gate 32 of transistor 30.

An advantage of the present invention is that layer 120 can be quite thin, so that its own dielectric constant (which can be higher than that of the main organic layer) will have minimal impact on the overall capacitance of the interconnection and minimum effect on planarization.

In the prior art such as the cited patent, the photosensitive layer had to be at least one half micron thick in order to avoid pinholes, which would permit etching gases to damage the layer beneath. If such a thick layer were left in the circuit, there would be a corresponding difficulty in maintaining the necessary planarization.

Figure 2:
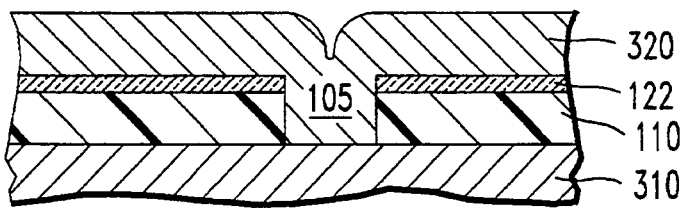

Referring now to FIG. 2, the use of this structure in protecting the main layer during damascene metal patterning is illustrated. A via 105 that will contain a vertical stud connecting a lower conductor 310 (either polysilicon or metal) has been etched through a temporary silicon nitride layer 122 using a conventional set of reactive etch gases. Subsequently, the same pattern has been etched into the main layer 110 using an oxygen based plasma. Shown in FIG. 2 is a metal conductor layer 320 which over-fills the groove and is polished to remove the excess metal, thereby leaving a conducting plug in the via.

Figure 3:
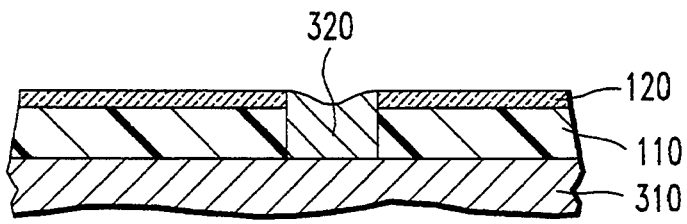

In the next figure, FIG. 3, the excess metal 320 has been removed in a conventional chemical-mechanical polishing step, after which nitride 120 has been stripped and been replaced by etch resistant polyimide 120.

Figure 4:
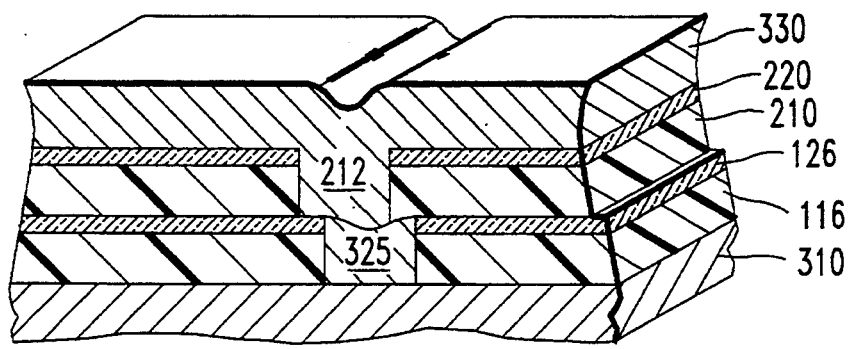

A composite structure is shown in perspective in FIG. 4, showing the completed stud 325 making contact with a top metal layer 330. The geometry of this embodiment is that lower conductor 310 extends horizontally, stud 325 has approximately the same depth perpendicular to the plane of the drawing as conductor 310 and aperture 212 in second polyimide layers 210 and 220 extends for some distance perpendicular to the plane of the drawing. Layer 320 may be patterned by a RIE step to extend horizontally parallel to conductor 310. In that case, an inorganic polish stop is not needed and the final polyimide etch resistant layer 220 can be put down instead of using a temporary polish stop layer such as layer 122 in FIG. 2. Those skilled in the art will appreciate that soft or thin layers to be removed will not necessarily need the greater hardness of an inorganic polish stop and harder permeable polish stop layers may be used and left in place.

Whether a temporary polish stop is used or not, the etch resistant layer 120 and 220 provide the etch resistance required for forming a subsequent level using partially intersecting wiring rules, and protect the main layer from undesirable etching. FIG. 4 also shows the case of a successive composite organic layer 230 comprising layers 210 and 220 coated over layer 120 of FIG. 3. An aperture 212 has been etched into the organic layer 310, which partially intersects stud 325 as permitted by the design rules. Without the etch stop of layer 120, the etching process required to form aperture 212 would have etched into layer 110. Once the overetching required to form aperture 212 is completed, the etch stop layer is removed from the contacting area using different gases and etch conditions, for minimal overtime, under conditions of least etching of layer 110.

If, instead of a chemical mechanical polishing operation on layer 330, a RIE patterning operation is performed to provide a layer of interconnect made from layer 330, there would be a problem with damage from the etching gases (especially chlorine). In addition to protecting layer 110 from attack, layer 120 provides a barrier to the etching gases used in a metal RIE process, so that they are not absorbed in layer 110, causing reliability problems. In one modification of the embodiment, useful in the case of a metal RIE process, the etch resistance layer is chosen different from the permeable layer, which after the patterning of layer 330 is removed and replaced with the etch resistant layer with permeable feature.

The following detailed process steps were used in reducing to practice one of the embodiments of the invention wherein a polyimide layer used in a metal damascene process to fabricate a multilayer structure. A main layer of polyimide was formed by coating a layer of Biphenyl diamine-phenyl diamine dissolved in the solvent n-methyl pyridene (NMP) which is baked at 100° C. followed by curing in a nitrogen atmosphere at 400° C. for 30 minutes. The polyimide surface was briefly ashed for 2 minutes to improve adhesion and about 2300 Å of PECVD silicon nitride polish stop was deposited. By using photoresist a pattern was etched, first the silicon nitride using fluorine plasma, followed by etching the pattern in polyimide by using an oxygen plasma. The photoresist is entirely removed during the etching of the polyimide insulator. The nitride layer is subsequently thinned by a fluorine plasma in the course of removing the lower etch stop to leave an average thickness of 1000 Å. The entire wafer with the pattern is overcoated with a metal seed layer and overcoated with a thicker layer. In the process of putting down the metal layer, both CVD and plating were exercised, while the seed layer was deposited by sputtering. After chemical mechanical polishing to remove excess metal from the non-pattern area, the wafer was brush cleaned and the remaining silicon nitride was removed by fluorine plasma. The surface was exposed to a plasma containing water to improve adhesion. An etch resistant layer is spin coated from a solution consisting of a copolymer of polymethyl/phenyl siloxane and the polyamic ethyl ester of Biphenyl diamine-oxydianiline (BPDA-ODA) dissolved in a solution of NMP, 1,3-dimethoxybenzene and o-xylene. This layer is cured to obtain a thickness of 1500 Å. The above steps are repeated to form the next layer of interconnection. In the step of forming a pattern in the layer above, the etch stop layer formed from the silicon-loaded copolymer allows the etching of a non-overlapping pattern. The silicon nitride thinning step will remove the etch stop layer selectively from the contact areas, thereby allowing the deposition of metal and making ohmic contact between the two metal layers in the area of overlap.

Those skilled in the art will readily appreciate that many variations may be made on the embodiment disclosed. The invention can be used with bipolar or field effect transistors, bulk or silicon on insulator processes, single or double level poly processes, multiple layers of organic dielectric, and different combinations of organic materials and etching processes.

We claim:

1. A process of forming a reliable chip interconnection structure with at least two wiring levels having organic insulator and a permeable etch stop layer, comprising the steps of:
    a) providing an integrated circuit on semiconductor with a plurality of devices, said devices being covered with a layer of inorganic insulator, having a first surface and containing therein a plurality of first apertures and a first set of conductors passing over and making contacts to said devices through said first apertures;
    b) coating said first surface with a first organic layer, having a first organic layer thickness, and a first etch stop layer, having a first etch stop layer thickness less than said first organic layer thickness, permeable to outgassing vapors from said organic layer underneath in subsequent process steps, thereby forming a first composite dielectric layer;
    c) patterning a plurality of second apertures in said etch stop layer and said first organic layer;
    d) patterning a second conductor over said first etch stop layer to form a second set of conductors connecting said first set of conductors through said second apertures;
    e) coating said second set of conductors with a second organic layer, having a second organic layer thickness, and a second etch stop layer, having a second etch stop layer thickness less than said second organic layer thickness, permeable to outgassing vapors from said organic layer underneath in subsequent process steps, thereby forming a second composite dielectric layer;
    f) patterning a plurality of third apertures in said second organic layer and second etch stop layer, stopping on said first etch stop layer; and
    g) patterning a third conductor over said second etch stop layer, said conductor contacting said second conductor through said third apertures; and repeating said steps b) to g) at least once; in which at least one of said first and second etch stop layers is formed subsequent to the formation of an inorganic etch stop layer over one of said first and second organic layers to protect said one of said first and second organic layers from a reactive ion etching step, followed by removal of said inorganic etch stop layer.

2. A process of forming a reliable chip interconnection structure with at least two wiring levels having an organic insulator and a permeable etch stop layer, comprising the steps of:
    a) providing an integrated circuit on semiconductor with a plurality of devices, said devices being covered with a layer of inorganic insulator, having a first surface and containing therein a plurality of first apertures and a first set of conductors passing over and making contacts to said devices through said first apertures;
    b) coating said first surface with a first organic layer, having a first organic layer thickness, and a first etch stop layer, having a first etch stop layer thickness less than said first organic layer thickness, permeable to outgassing vapors from said organic layer underneath in subsequent process steps, thereby forming a first composite dielectric layer;
    c) patterning a plurality of second apertures in said etch stop layer and said first organic layer;
    d) patterning a second conductor over said first etch stop layer to form a second set of conductors contacting said first set of conductors through said second apertures;
    e) coating said second set of conductors with a second organic layer, having a second organic layer thickness, and a second etch stop layer, having a second etch stop layer thickness less than said second organic layer thickness, permeable to outgassing vapors from said organic layer underneath in subsequent process steps, thereby forming a second composite dielectric layer;
    f) patterning a plurality of third apertures in said second organic layer and second etch stop layer, stopping on said first etch stop layer; and
    g) patterning a third conductor over said second etch stop layer, said conductor contacting said second conductor through said third apertures; and repeating said steps b) to g) at least once; in which at least one of said first and second etch stop layers is formed subsequent to the use of an inorganic etch stop over one of said first and second organic layers to protect said one of said first and second organic layers from a metal polishing process, followed by removal of said inorganic etch stop.

3. A process according to claim 1, in which at least one of said first and second etch stop layers comprise organic insulators co-polymerized with a silicon containing organic compound.

4. A process according to claim 2, in which at least one of said first and second etch stop layers comprise organic insulators co-polymerized with a silicon containing organic compound.

* * * * *